(12) United States Patent
Joist et al.

(10) Patent No.: US 9,345,157 B2
(45) Date of Patent: May 17, 2016

(54) HOUSING FOR ELECTRICAL DEVICES

(71) Applicant: Schroff GmbH, Straubenhardt (DE)

(72) Inventors: Michael Joist, Gaggenau (DE); Stefan Curatolo, Muggensturm (DE)

(73) Assignee: Pentair Technical Solutions GmbH, Straubenhardt (DE)

( * ) Notice: Subject to any disclaimer, the term of this patent is extended or adjusted under 35 U.S.C. 154(b) by 0 days.

(21) Appl. No.: 14/340,869

(22) Filed: Jul. 25, 2014

(65) Prior Publication Data
US 2015/0091419 A1    Apr. 2, 2015

(30) Foreign Application Priority Data
Sep. 27, 2013    (EP) .................................. 13 186 297

(51) Int. Cl.
*A47G 29/00*    (2006.01)
*H05K 5/02*    (2006.01)
*G06F 1/18*    (2006.01)
*H05K 5/04*    (2006.01)
*H05K 5/00*    (2006.01)

(52) U.S. Cl.
CPC ............. *H05K 5/0239* (2013.01); *G06F 1/181* (2013.01); *H05K 5/0004* (2013.01); *H05K 5/04* (2013.01)

(58) Field of Classification Search
CPC ........... A47B 47/0025; A47B 47/0075; Y10T 16/536; Y10T 16/531; Y10T 16/53625; Y10T 16/54044; Y10T 16/53613; H05K 5/0239; H05K 5/00; G06F 1/181; E05D 1/06

USPC ........ 312/265.5, 265.6, 257.1, 263, 264, 265, 312/262; 16/260, 269, 266
See application file for complete search history.

(56) References Cited

U.S. PATENT DOCUMENTS

| 5,359,587 | A | * | 10/1994 | Uehara | .......................... 720/600 |
| 6,114,622 | A | | 9/2000 | Draeger | |
| 8,246,125 | B2 | * | 8/2012 | Chen | .......................... 312/223.2 |
| 2008/0263976 | A1 | * | 10/2008 | Howell | ................ H02G 3/0418 52/220.7 |

FOREIGN PATENT DOCUMENTS

DE    297 21 480 U1    3/1998

* cited by examiner

*Primary Examiner* — Daniel J Troy
*Assistant Examiner* — Andres F Gallego
(74) *Attorney, Agent, or Firm* — Bose McKinney & Evans LLP

(57) ABSTRACT

A housing for electrical devices is composed of four sheet metal parts, namely a base part, two side parts and a lid. The base part is bent in a U-shape and has a rectangular bottom plate with two opposing connecting edges. Each of the side parts has a lower connecting edge and can be placed laterally against the base part. The lid has a connecting edge and an opposing edge that is folded over. Connecting links and mounting tabs offset inwardly in a Z-shape are arranged on the connecting edges. The mounting tabs engage partially in cutouts of the connecting links, thus forming a hinge-like positive connection of two adjacent housing parts.

15 Claims, 9 Drawing Sheets

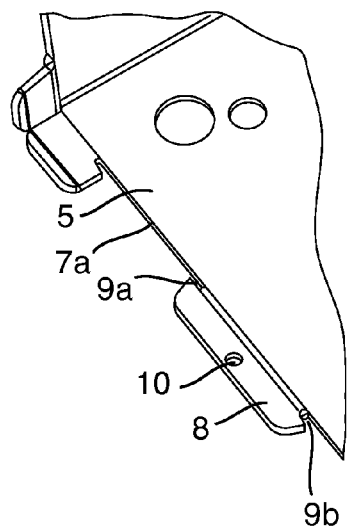
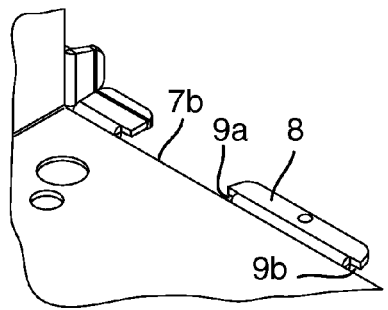
Fig. 2b
Fig. 2c
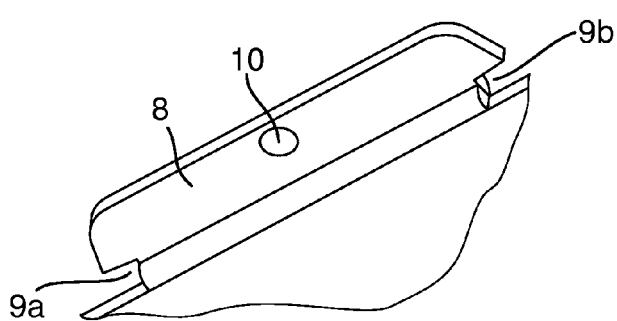
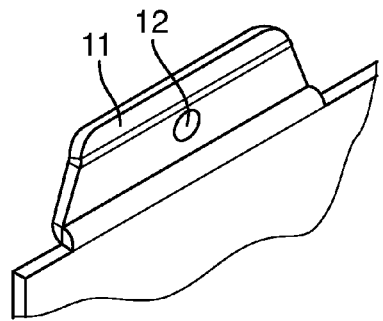
Fig. 3a
Fig. 3b

HOUSING FOR ELECTRICAL DEVICES

RELATED APPLICATIONS

This application claims priority to EP 13 186 297.1, filed Sep. 27, 2013, the entire disclosure of which is hereby incorporated herein by reference.

BACKGROUND

The invention relates to a housing for electrical devices that is composed of at least four housing parts of bent sheet metal.

For individual electronic devices, it is preferred to use housings that consist substantially only of bent sheet metal blanks. This offers the advantage that no size-dependent molded parts, such as diecast frame or side parts, need to be manufactured and held available. The dimensions of the housing in all three directions, i.e., width, height and depth, can therefore be variably set, so that it is possible to react flexibly to changing demands. Moreover, sheet metal parts of steel or aluminum can be cost-effectively and flexibly manufactured from steel or aluminum through NC or laser processing. Special, customer-specific desires such as special holes or recesses in the front or rear wall or additional ventilation slots in the lid can be fulfilled as needed together with the standard processing. Housings that are merely composed of a few sheet metal parts are therefore particularly suited especially to smaller lot sizes down to individual production.

In order to install detachable parts such as the main board, electronic plug assemblies or power supplies, it is necessary for the housings to always be composed of multiple parts. The installed parts must remain accessible even after assembly in order to conduct tests, for example, or replace defective parts. Nonetheless, the closed housing must be sealed as well as possible, particularly if a high level of electromagnetic compatibility (EMC) is required.

Housings are known which consist of two U-shaped sheet metal parts that are placed against each other. Three-part housings are also known which consist of a multiply folded base part, a flat lid and a flat, removable front plate. Known housings, which consist of four parts comprise, for example, a U-shaped bottom part, front plate, rear side and U-shaped bent hood cover.

In order to put the individual parts together, special connecting means are required. Hooks, tabs or tongues that engage in corresponding recesses of the adjacent sheet metal part are worthy of consideration, for example. The front and/or rear side and the lid are also often screwed on in order to enable removal as needed. Screwed connections are time-consuming, however, and require a tool. Housings whose individual parts are assembled only by means of clamp or locking connections are oftentimes neither especially stable nor sufficiently sealed or shielded.

Therefore, what is desired is a housing that is manufactured from a few sheet metal blanks, can be assembled in as quick and trouble-free manner as possible, has a high level of mechanical stability and a very good seal both against dust and against electromagnetic radiation without the use of additional connecting means, and in which at least the front side can be designed per client specifications without problems.

SUMMARY

This disclosure teaches a housing composed of at least four parts of bent sheet metal, namely a base part, a first side part, a second side part and a lid.

The base part is bent in a U-shape and comprises a rectangular bottom plate as well as two folded-up sidewalls. The two laterally arrangeable side parts form the front plate or the rear wall of the housing. A lid that can be inserted between the side parts closes the housing.

The arrangement and design of the connecting edges is essential. In relation to this disclosure, these are understood as being those edges of the housing parts that are necessary in order to positively join the individual housing parts without a tool.

According to this disclosure, the U-shaped base part and the first side part each have two connecting edges. The second side part and the lid have only one connecting edge. All connecting edges run parallel to each other.

Connecting links and corresponding mounting tabs are arranged alternatingly (alternately) on the connecting edges of two adjacent sheet metal parts. The connecting links and mounting tabs are offset inwardly in a Z-shape. The connecting links have cutouts in both sides into which the corresponding mounting tabs of the adjacent sheet metal part engage partially, i.e., to some extent, from the side. This makes a hinge-like connection between adjacent sheet metal parts possible that enables swiveling of one part with respect to the other part about the common abutting edge. This articulated connection gives way to a positive connection in the assembled state, which is to say that the housing parts connected by means of connecting links and mounting tabs are immovably joined together when the housing is completely assembled and closed.

To assemble the housing according to this disclosure, the two side parts are first placed with their respective connecting edges against the connecting edges of the base part by inserting the mounting tabs on the connecting edges of the side parts into the cutouts of the connecting links on the connecting edges of the base part. This initially results in a hinge-like connection. Through subsequent swiveling of the side parts, the connecting links and corresponding mounting tabs form a positive connection. The two abutted side parts now form the front side and rear side of the housing, and the sidewalls are formed by the U-shaped base part.

The lid is then inserted. For this purpose, the mounting tabs arranged on the connecting edge of the lid are inserted into the cutouts of the connecting links on the upper connecting edge of the first side part, specifically edgewise. Through subsequent swiveling of the lid in the direction of the bottom plate—in other words: by folding it closed—a positive connection is established between lid and side part along abutting edges of lid and first side part.

When the lid is completely closed, its edge folded downward at a right angle extends over the second side part. Since the connecting edge of the lid opposite the edge is positively connected to the connecting edge of the adjacent first side part, the lid pulls the upper connecting edge of the first edge part against the vertical edges of the sidewalls of the base part upon closing.

Upon closing of the lid, all four housing parts stabilize each other mutually. There is no need for any additional fastening means in order to obtain a stable closed housing. As needed, the lid can additionally be connected to the second side part with one or two small screws only to secure it against unintentional opening.

The connecting links and mounting tabs are offset inwardly, which is to say toward the interior of the housing, by approximately the thickness of the sheet metal. This results in the desired clamping effect after the joining of the sheet metal parts. In the connecting links, the Z-shaped offset creates, in cooperation with the lateral cutouts, exactly enough space for the engagement of the corresponding mounting tabs so that the mounting tabs can be introduced unimpeded into the cutouts and subsequently swiveled into same without seizing.

To facilitate the introduction of the mounting tabs into the cutouts of the connecting links, the mounting tabs can be narrower toward their free end, whereas they can have their full width in the region of offset. By virtue of their conical contour, the mounting tabs are centered automatically in the cutouts of the connecting links, thus ensuring correct mutual alignment of the sheet metal parts to be connected.

Although it is sufficient in principle if two connecting links and mounting tabs are provided for each connecting edge at a sufficient lateral distance from each other, it is expedient to distribute the connecting links and mounting tabs over the entire length of a connecting edge, preferably in a modular matrix. For one, this enables the optimum manufacture of the links and tongues using computer-controlled production machines, and for another, a homogeneous distribution of the connecting forces is achieved along the lines of connection.

Connecting links and mounting tabs must be arranged alternatingly (alternately) on the abutting connecting edges of two adjacent sheet metal parts such that one housing part—a side part, for example—can first be placed with its edge against the other housing part—the base part, for example—and then swiveled about this edge in order to establish a positive connection between the mounting tabs and the connecting links. In the assembled state, the mounting tabs of the abutted sheet metal part, i.e., of a side part, for example, then lie on the same plane as the connecting links of the adjacent housing part, i.e., of the base part with bottom plate, for example. As a result of the alternating arrangement, connecting links and mounting tabs alternate along the common connecting edge. In the region of the connecting edge, the mounting tabs are somewhat wider than the gap between the adjacent connecting links, so that the mounting tabs engage to some extent into the cutouts of the adjacent connecting links to the right and left.

There are several possibilities for arranging the alternating connecting links and mounting tabs such that, when the housing is assembled, they are parallel to the sheet planes of both sheet metal parts to be connected or are on the same plane. A first possibility consists, for example, of having the connecting links of the first sheet metal part run parallel to the sheet plane and folding down the mounting tabs of the adjacent sheet metal part at a right angle with respect to the sheet plane of this second sheet metal part. A second possibility is for one of the sheet metal parts, such as a side part, to be provided with a web plate folded inward at a right angle and to shift the mounting tabs or connecting links to the free edge of this web plate. Since the side walls and front and rear side of a rectangular housing are naturally vertical but the bottom and lid run horizontally, this makes it necessary, at least in a portion of the connecting edges, either to arrange the connecting links or the mounting tabs at a right angle with respect to the sheet plane of the main surface of the housing part in question.

In one embodiment of the housing according to this disclosure, the first side part and the second side part have web plates folded over at right angles whose free edges form the connecting edges, which is to say they have connecting links or mounting tabs. Then a fitting base part can be created in which the connecting links run parallel to the plane of the bottom plate at both connecting edges. In order to put the side parts in place, they must be rotated outward by about 90 degrees, specifically, in order to be able to introduce the mounting parts from below into the cutouts of the connecting links of the base part. Mounting tabs and connecting links are arranged approximately at right angles to each other. To establish the positive connection, the side parts are then rotated back to vertical so that mounting tabs and connecting links run approximately parallel.

Preferably, the first side part is U-shaped in cross section, with the flat U-back forming the front or rear side of the housing and the free edges of the U-arm being embodied as connecting edges. The second side part is then preferably L-shaped, with the free edge of the short L-arm being embodied as a connecting edge.

If the side parts have web plates folded down at a right angle, it is expedient to guide these web plates around the lower corners to the vertical. The distance resulting from the folded web plate between the main surface of the side part, which forms the front or rear side of the housing, and the vertical edges of the adjacent side walls is bridged over by the web plates guided around the corner. It is therefore preferable for the second side part to be folded inwardly at a right angle on three sides.

One of the side parts, preferably the first side part, can have web plates folded inwardly at a right angle on all four sides. This side part is then embodied in the manner of a tub or hood that extends the sidewalls of the housing. The length of the folded web plates is dimensioned such that they are able to receive at least the length of the connecting links or mounting tabs of the adjacent sheet metal part.

The free edges that are not embodied as connecting edges in terms of this disclosure can optionally also be provided with other mounting tabs that are shifted inwardly in a Z-shape, even if these additional mounting tabs do not serve to engage in connecting links, in order to establish a positive connection. In particular, it is expedient to arrange such additional mounting tabs on the upper edge of the L-shaped side part and on the free upper edges of the angled side walls of the base part that are aligned parallel to the sheet plane. Accordingly, the edge of the lid is preferably folded inwardly on three sides at a right angle, so that the upwardly protruding mounting tabs on the upper edge of the second side part and on the upper edges of the side walls of the base part are extended over by the folded edge of the lid as soon as the lid is completely closed. The additional mounting tabs overlap upon assembly with the inner sides of the respectively adjacent sheet metal part, so that a certain mutual clamping effect is produced along these edges as well. The lid is also optionally provided with additional mounting tabs, preferably on at least three sides, which run parallel to the sheet plane of the adjacent side part and the adjacent sidewalls.

Advantageously, the connecting links and/or mounting tabs have clamping noses or comparable raised areas such as nubs or bars, for example, on their outer sides. As a result, the clamping effect between connecting link or mounting tab and the inner side of the adjacent sheet metal part is increased. Moreover, the clamping noses provide a reliable electrical contact, which is important in order to meet increased demands for electromagnetic compatibility (EMC).

Housings are usually painted, particularly powder-coated. In order to connect the sheet metal parts from which the housing according to this disclosure is manufactured to each other with good conductivity, care should be taken that at least the sides of the sheet metal parts facing inward remain bare. This requirement can easily be met by first assembling the housing and powder-coating all of the visible outer sides only after the lid is closed.

Materials that are worthy of consideration for the manufacture of the housing parts are, above all, steel sheet or aluminum sheet. The housing parts need not necessarily be made of the same material. Preferably, at least one of the two side parts, namely the side part forming the front of the housing, is made of aluminum sheet. This renders it easier to work both at the time of manufacture and subsequently thereto in order to design the front plate according to client specifications, particularly to provide it with holes and recesses.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein:

FIGS. 2b, 2c show the connecting edges of the base part of FIG. 2a;
FIG. 3a shows an enlarged view of a connecting link;
FIG. 3b shows an enlarged view of a mounting tab.

DETAILED DESCRIPTION

The embodiments described below are not intended to be exhaustive or to limit the invention to the precise forms disclosed in the following detailed description. Rather, the embodiments are chosen and described so that others skilled in the art may appreciate and understand the principles and practices of this disclosure.

In this disclosure, terms such as "vertical," "parallel," "horizontal," "right angle," "rectangular" and the like are used to describe the orientation, position or general shape of structural elements disclosed herein. As would be readily recognized by one of ordinary skill, it shall be understood for purposes of this disclosure and claims that these terms are not used to connote exact mathematical orientations or geometries, unless explicitly stated, but are instead used as terms of approximation. With this understanding, the term "vertical," for example, certainly includes a structure that is positioned exactly 90 degrees from horizontal, but should be generally understood as meaning positioned up and down rather than side to side. Other terms used herein to connote orientation, position or shape should be similarly interpreted. Further, it should be understood that various structural terms used throughout this disclosure and claims should not receive a singular interpretation unless it is made explicit herein. By way of non-limiting example, the terms "plate," "housing part," "tab," to name just a few, should be interpreted when appearing in this disclosure and claims to mean one or more. All other terms used herein should be similarly interpreted unless it is made explicit that a singular interpretation is intended.

Figure 1:
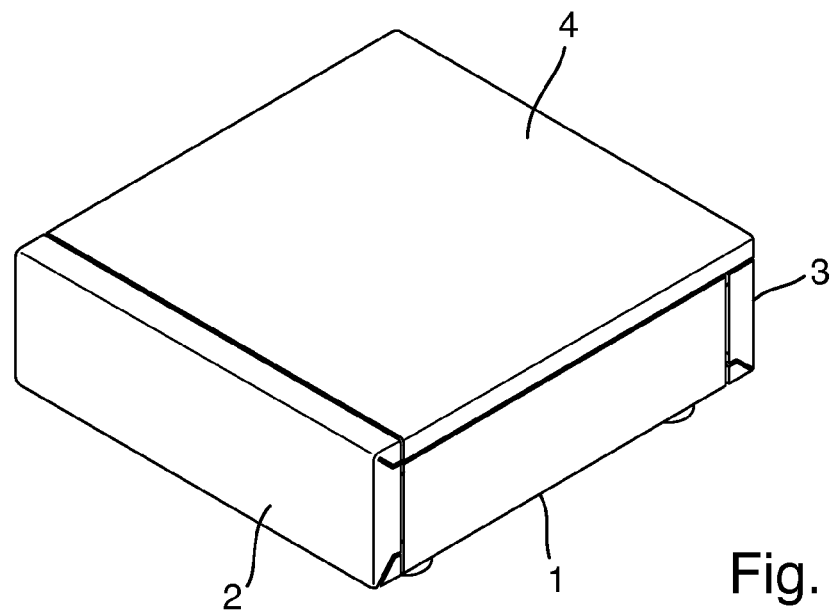
FIG. 1 shows a perspective view of a closed housing.

The housing depicted in FIG. 1 includes four parts made of bent sheet metal, namely, a base part 1, a first side part 2, a second side part 3 and a lid 4.

The base part 1 and the lid 4 are made of steel sheet, whereas the first side part 2 and the second side part 3 are made of aluminum sheet, which is easier to work subsequently.

Figure 2A:
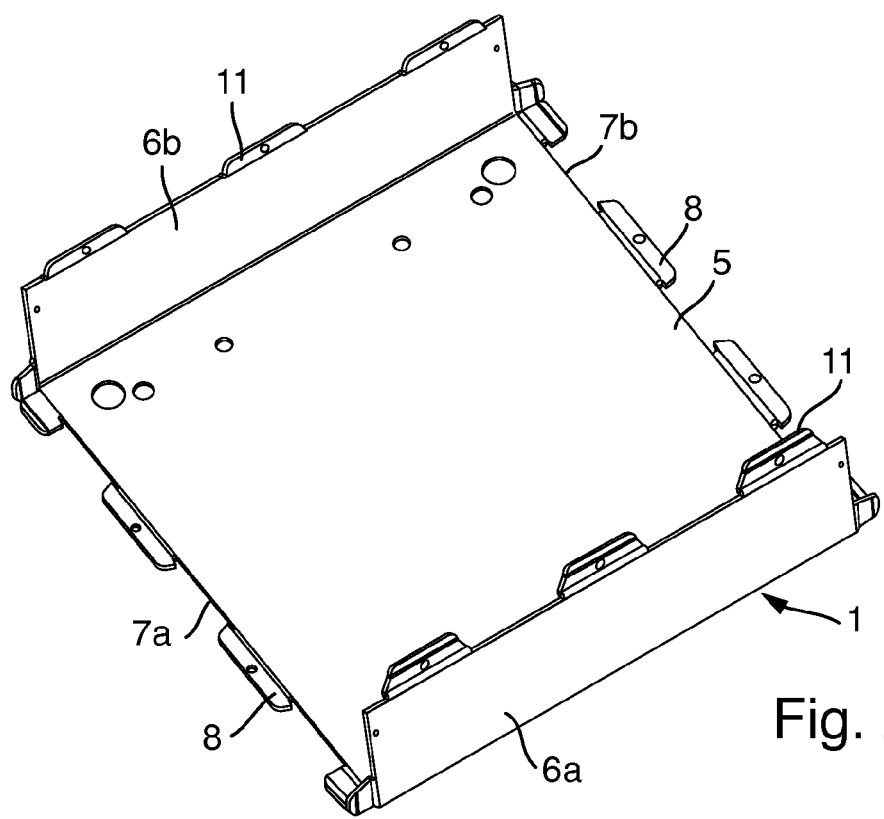
FIG. 2a shows the base part of the housing of FIG. 1.

FIG. 2a shows the base part 1 alone, bent in a U-shape. It comprises a rectangular bottom plate 5 and two sidewalls 6a and 6b folded up at a right angle. The two opposing edges of the bottom plate 5 that connect the sidewalls 6a, 6b are embodied as connecting edges 7a, 7b. Connecting links 8 are arranged at regular intervals along the connecting edges 7a, 7b.

FIGS. 2b, 2c show the two connecting edges 7a, 7b, each with one connecting link 8 in enlarged view. The connecting links 8 are offset inwardly with respect to the sheet plane in a Z-shape. Lateral cutouts 9a, 9b are provided in the region of the offset to the right and left. These cutouts 9a, 9b have a rectangular contour. The free corners of the connecting links 8 are rounded off. In the middle, the connecting links 8 have a clamping nose 10 whose raised area points downward, which is to say toward the outside of the housing.

In addition, the folded side walls 6a, 6b of the base part 1 also have mounting tabs 11 at their free edges. In FIG. 2a three mounting tabs 11 are respectively arranged for the sake of example on the upper edges of the side walls 6a, 6b. Two connecting links 8 are respectively arranged along the connecting edges 7a, 7b of the bottom plate 5. Larger housings will expediently be provided with a greater number of connecting links 8 and mounting tabs 11.

FIG. 3a shows an enlarged view of a single connecting link 8. A mounting tab 11 can be seen in FIG. 3b on the same scale. The mounting tabs 11 sloping side edges that taper with increasing distance from the sheet edge. The mounting tabs 11 also have clamping noses 12 that point outward.

Figure 4A:
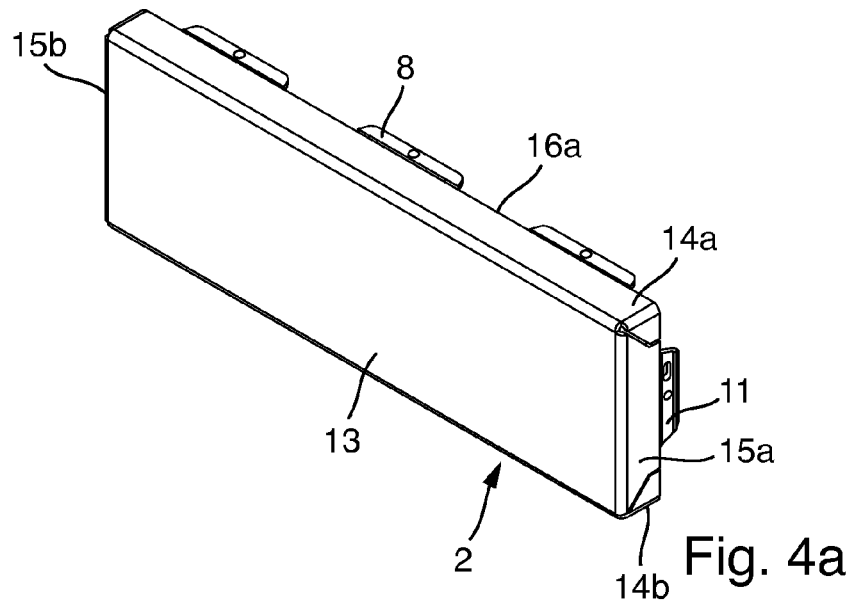
FIGS. 4a-4c show the first side part of the housing of FIG. 1.
Figure 4B:
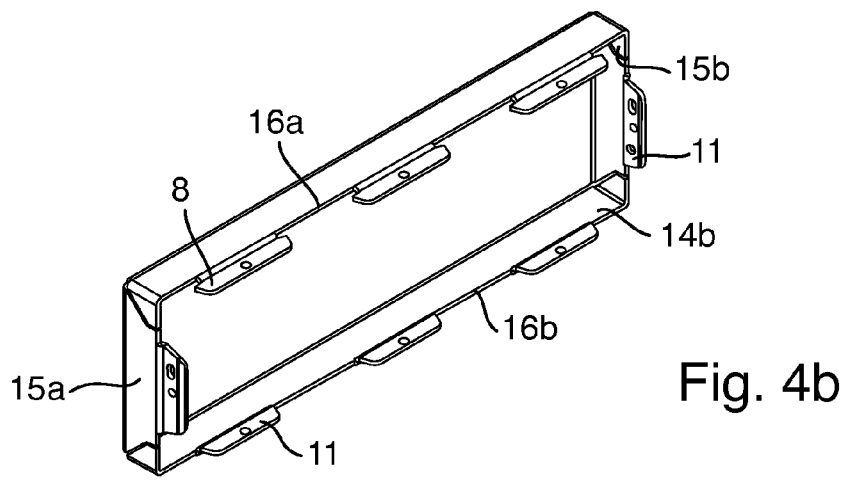
Figure 4C:
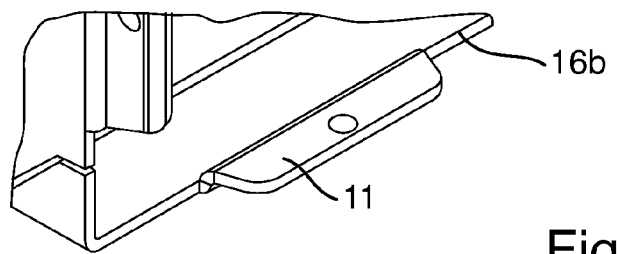

On its long edges, the first side part 2 (cf. FIG. 4a) has web plates 14a, 14b that are folded over at a right angle toward the inside of the housing. Each of these web plates 14a, 14b is guided around the right and left corner. Folded web plates 15a, 15b of equal length are also provided on both short sides. This side part 2 is thus embodied in the manner of a tub, with the tub bottom forming the flat front plate 13. The web plate 14a, 14b provided along the upper and the lower edge are embodied as connecting edges 16a, 16b. Connecting links 8 are arranged on the upper connecting edge 16a, whereas three mounting tabs 11 are arranged along the lower connecting edge 16b (cf. FIG. 4b). FIG. 4c shows an enlarged view of a mounting tab 11 on the lower connecting edge 16b. These connecting links 8 and mounting tabs 11 correspond to FIGS. 3a and 3b. Connecting links 8 and mounting tabs 11 are at a right angle to the front plate 13 but run parallel to the plane of the web plates 14a, 14b. Additional mounting tabs 11 are provided on the lateral web plates 15a, 15b that do not cooperate with connecting links.

Figure 5A:
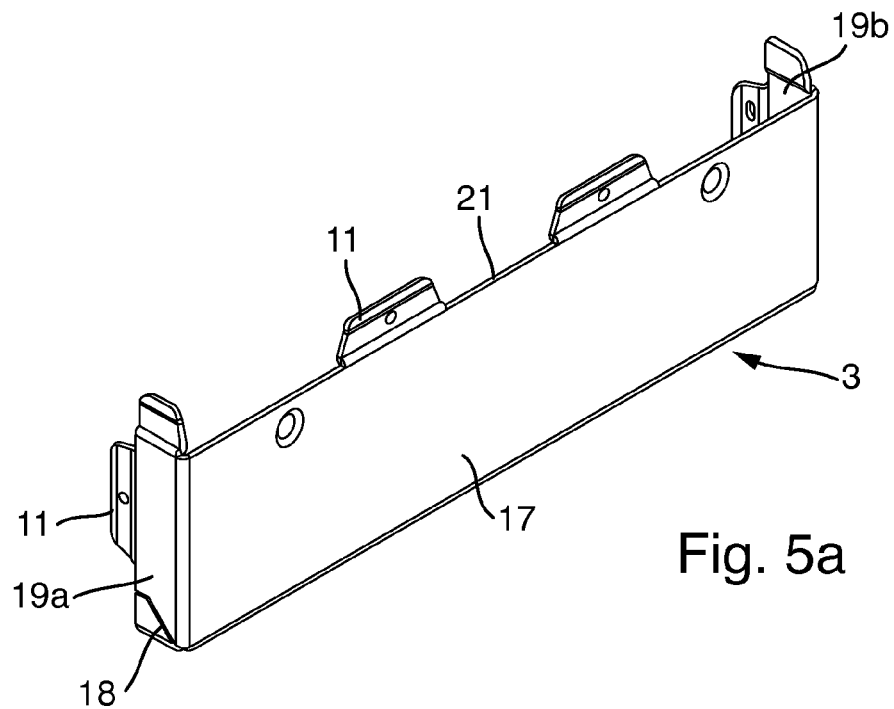
FIGS. 5a, 5b show the second side part.
Figure 5B:
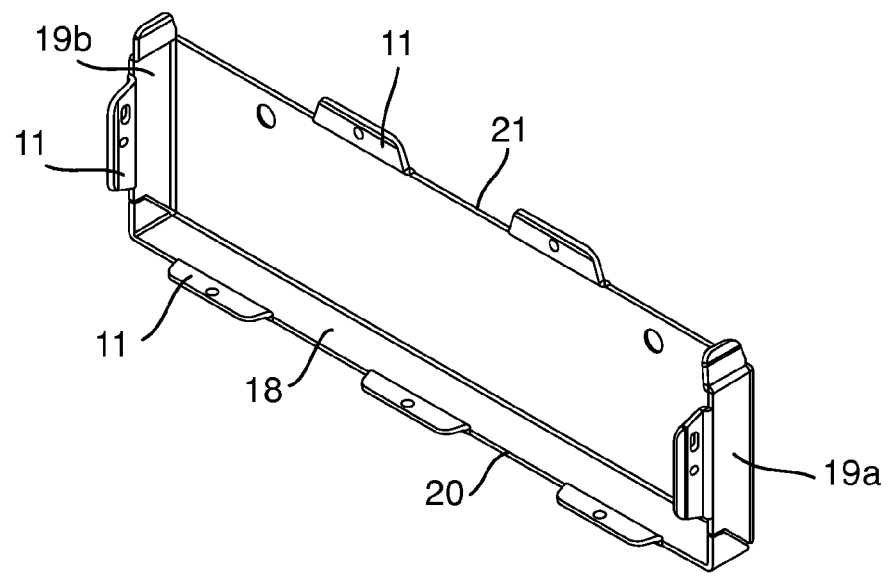

The second side part 3 forms the rear wall 17 of the housing (cf. FIGS. 1, 5a). This side part 3 has an L-shaped cross section, with the long L-arm forming the rear wall and the short L-arm being formed by a web plate 18 folded inward at a right angle. The web plate 18 is guided around the lower corners to the vertical, as can be seen particularly in FIG. 5b. Additional web plates 19a, 19b are folded inward at a right angle on the short sides. In the finished housing, these form the continuation of the sidewalls 6a, 6b of the base part 1 (cf. FIG. 1). On these lateral web plates 19a, 19b as well, additional mounting tabs 11 are provided that run parallel to the sheet plane of the web plates 19a, 19b.

In the second side part 3, only the free edge of the web plate 18 is embodied as a connecting edge 20. Mounting tabs 11 are arranged along this connecting edge 20 that correspond to the other mounting tabs on base part 1 and first side part 2 (cf. FIG. 3b). Other, equally embodied mounting tabs 11 are arranged on the upper edge 21 opposite the connecting edge 20; these run parallel to the plane of the rear wall 17 and do not cooperate with connecting links.

Figure 6:
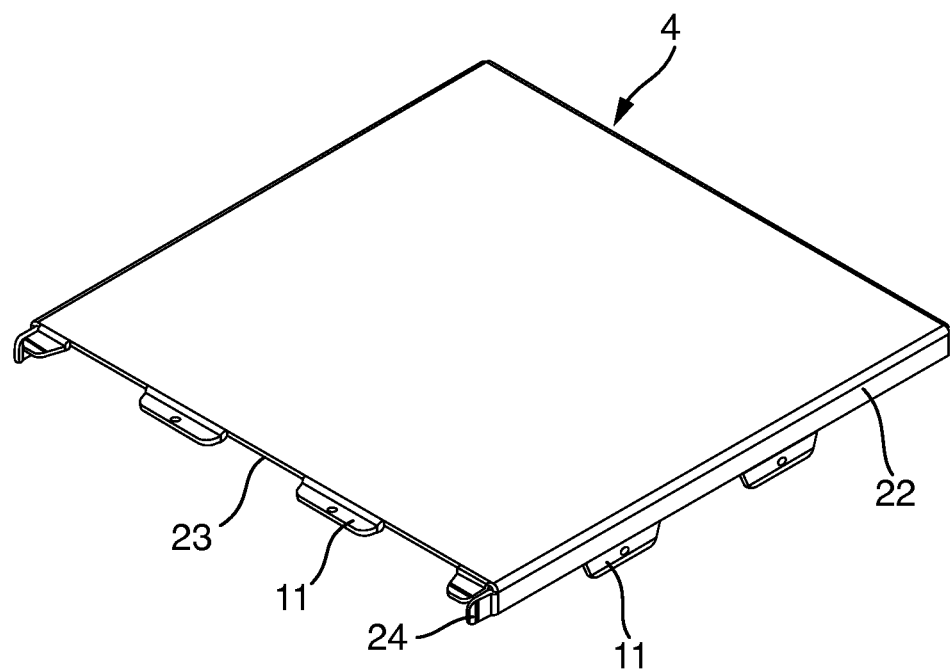
FIG. 6 shows the lid.

FIG. 6 shows the lid 4 alone as the first and last housing part. It forms the flat upper side of the housing. The edge 22 of the lid 4 is folded over inwardly on three sides at a right angle, which is to say downward in FIG. 6. A connecting edge 23 is embodied on the fourth side that has two mounting tabs 11. These mounting tabs 11 also correspond to the mounting tabs on the other housing parts. Other, equally embodied mounting tabs 11 are located on the free edges of the downwardly bent edge 22, and these other mounting tabs 11 do not cooperate with connecting links 8.

In addition, special corner tongues 24 are provided on the right and left front corner of the lid 4. Similar corner tongues are also provided on the four lower corners of the base part 1 (cf. FIG. 2a).

The assembly of the housing will now be described.

Figure 7A:
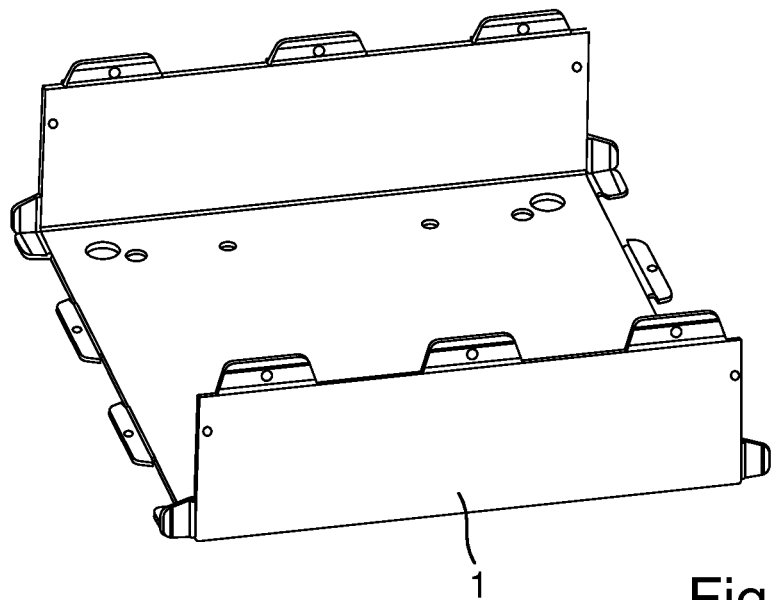
FIGS. 7a-7d show the mounting of the side parts.
Figure 7B:
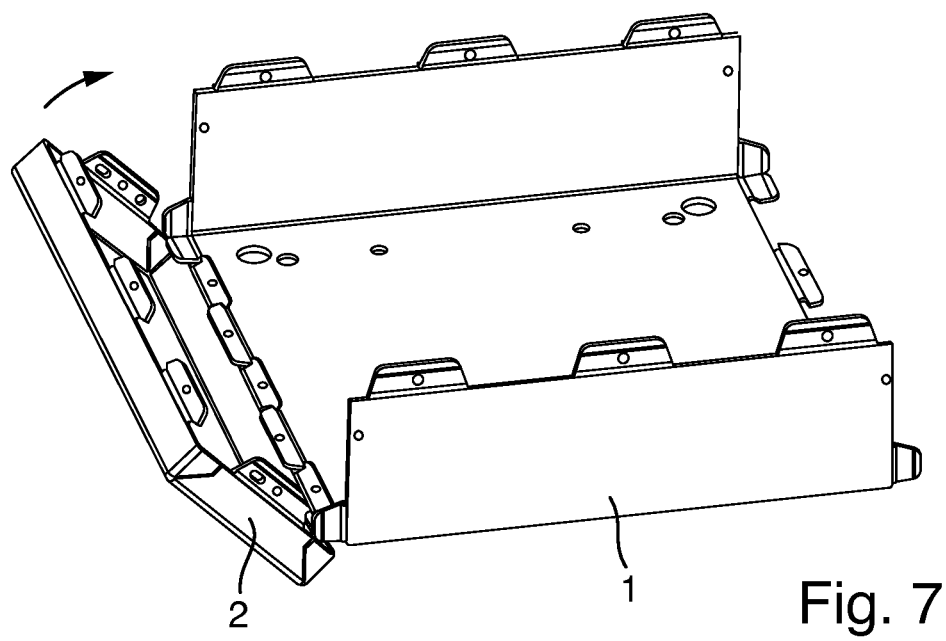

The first side part 2 is first placed against the readied base part 1 (FIG. 7a). To do this, the side part 2 is placed in a rotated position with its lower connecting edge 16b (cf. FIG. 4b) against the adjacent connecting edge 7a of the base part (cf. FIG. 2a). The mounting tabs 11 engage on the connecting edge of the side part 2 in the cutouts 9a, 9b of the connecting links 8 of the base part 1. If the side part 2 according to FIG. 7b is now rotated to the vertical, connections that are initially hinge-like and then positive are created between the connecting links 8 and the mounting tabs 11.

Figure 7C:
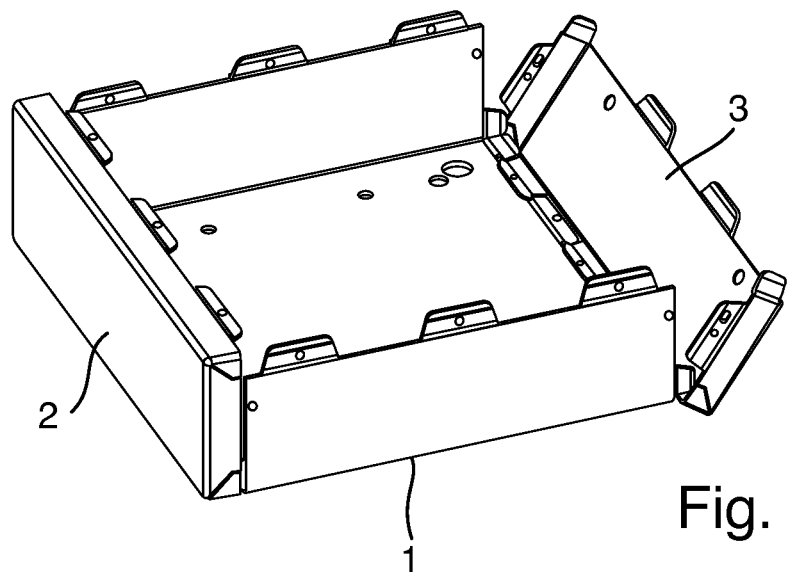

In the second step (FIG. 7c), the second side part 3 is placed against the opposing second connecting edge 7b of the base part 1 (cf. FIG. 2a). Here, too, the alternatingly arranged connecting links 8 and mounting tabs 11 form a hinge-like positive connection between the two housing parts.

Figure 7D:
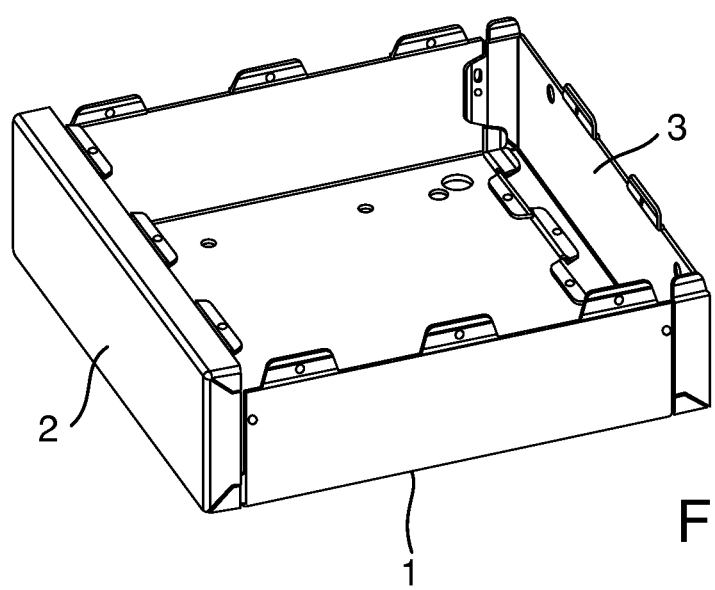

In FIG. 7d, the two side parts 2 and 3 are only connected positively to the base part 1 with their respective lower edges, which are embodied as connecting edges 16b, 20. The additional mounting tabs 11 on the web plates 15a, 15b and 19a, 19b fix the side parts 2, 3 through mere clamping against the side walls 6a, 6b of the base part 1. In this state, the side parts 2, 3 can therefore still be tipped again outwardly with relative ease; the lower part of the housing that has been created up to then is not yet inherently stable.

Figure 8A:
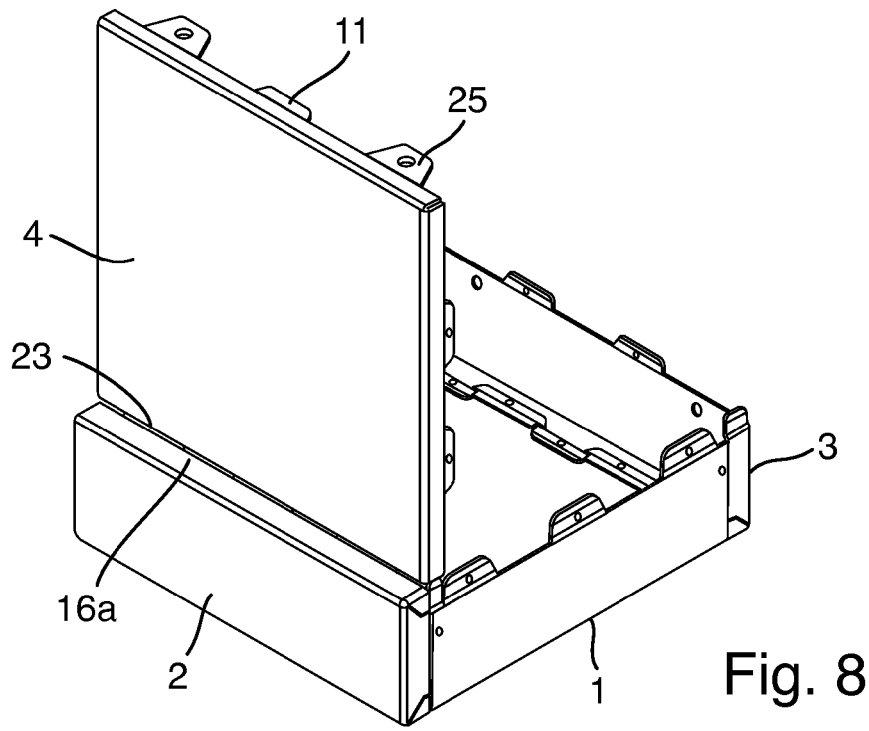
FIGS. 8a-8e show the placing and closing of the lid.
Figure 8B:
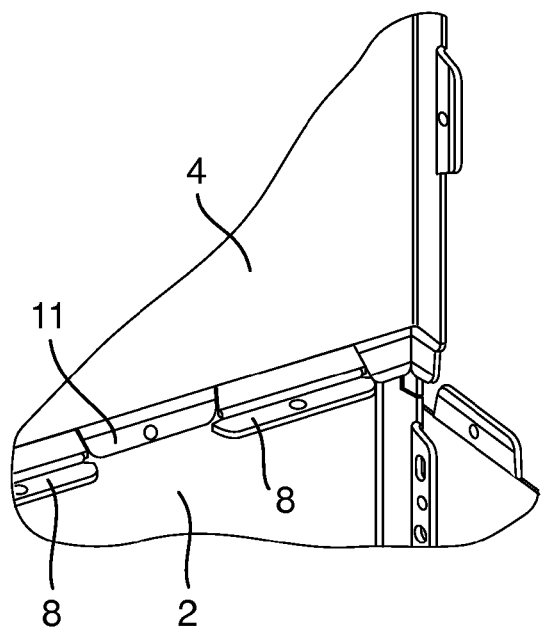

Lastly, the lid 4 is mounted. As can be seen in FIG. 8a, the lid 4 is placed approximately vertical for this purpose and placed with its connecting edge 23 against the upper connecting edge 16a of the first side part 2. As can be seen in FIG. 8b, the mounting tabs 11 of the lid 4 engage in the cutouts 9a, 9b (cf. FIG. 3a, FIG. 4b) of the corresponding connecting links 8 of the side part 2.

Figure 8C:
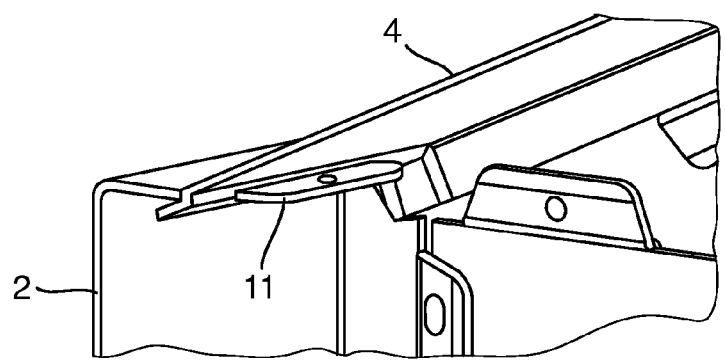
Figure 8D:
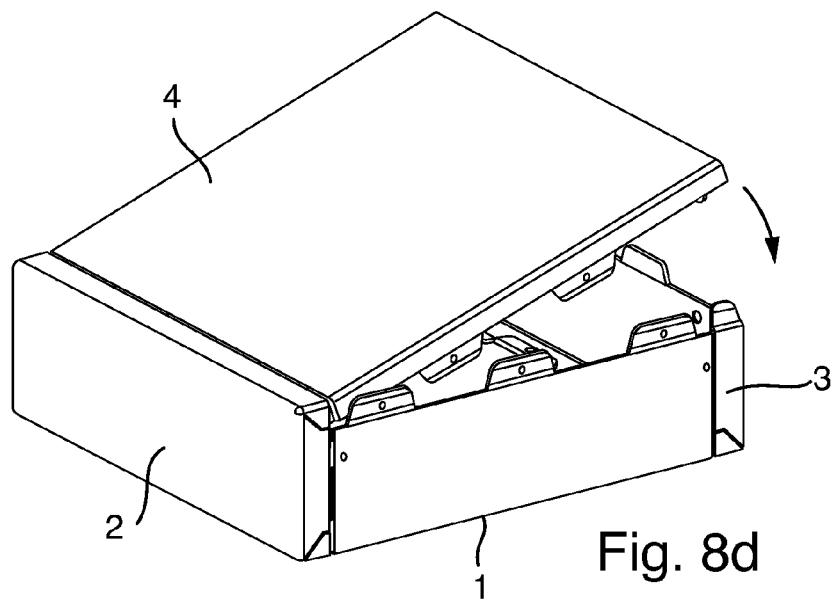

If the lid 4 is now swiveled, which is to say flipped closed, the connecting links 8 and the mounting tabs 11 engaged with them act as a hinge (FIG. 8c). As the lid is closed further (FIG. 8d), the hinge-like connection transforms into a positive connection, that is, the lid 4 can no longer be detached from the adjacent side part 2.

Figure 8E:
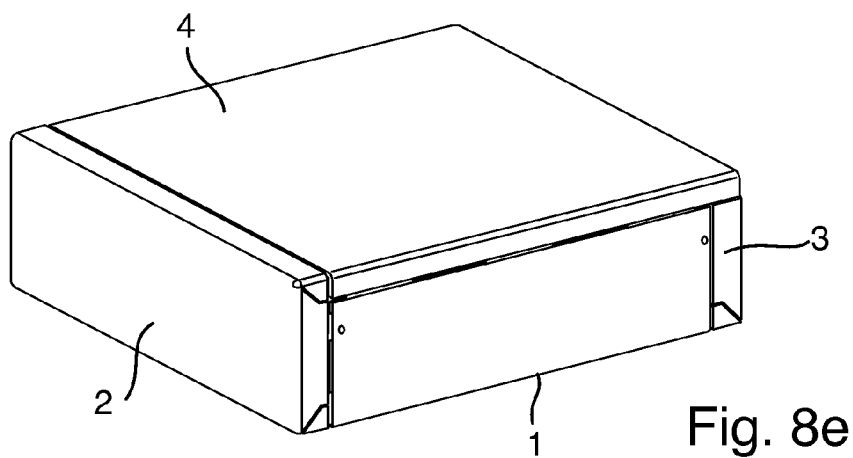

In FIG. 8e, the lid 4 is completely closed. Its folded edge 22 extends over the mounting tabs 11 on the upper edge 21 of the second side part 3, which forms the rear wall 17 of the housing here. The second side part 3 is thus stabilized. All four housing parts, i.e., base part 1, first side part 2, second side part 3 and lid 4, are now positively connected to each other without an additional fastening element. The additional mounting tabs 11 on the edge 22 of the lid 4 and on the adjacent upper edges of the sidewalls 6a, 6b of the base part 1 provide additional stability.

Only to secure against unintentional lifting of the lid 4, it can be connected to the second side part 3 as needed using one or two small screws. For this purpose, the lid 4 can have one or two threaded tabs 25 on its edge opposite the connecting edge 23.

While exemplary embodiments have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

REFERENCE SYMBOLS 1 base part
2 first side part
3 second side part
4 lid
5 bottom plate (1)
6a, 6b side walls (1)
7a, 7b connecting edges (1)
8 connecting link
9a, 9b cutouts (8)
10 clamping nose (8)
11 mounting tab
12 clamping nose (11)
13 front plate (2)
14a, 14b web plates (2)
15a, 15b web plates (2)
16a, 16b connecting edges (2)
17 rear wall (3)
18 web plate (3)
19a, 19b web plates (3)
20 connecting edge (3)
21 upper edge (3)
22 edge (4)
23 connecting edge (4)
24 corner tongues
25 threaded tab

What is claimed is:

1. A housing for electrical devices having housing parts formed of bent sheet metal, the housing comprising: a base part bent in a U-shape and having a rectangular bottom plate and two side walls folded upward at a right angle, the bottom plate having two opposing connecting edges on which inwardly offset connecting links are arranged along a plane offset inwardly from a sheet plane of the rectangular bottom plate; a first side part configured for lateral placement against the bottom plate, the first side part having lower and upper connecting edges parallel to the connecting edges of the bottom plate, the first side part comprising inwardly offset mounting tabs arranged on the lower connecting edge and inwardly offset connecting links arranged on the upper connecting edge; a second side part configured for lateral placement against the bottom plate, the second side part having an upper edge and a connecting edge that runs parallel to the connecting edges of the bottom plate, the connecting edge of the second side part having inwardly offset mounting tabs; and a lid that is insertable between the first and second side parts, the lid having a first connecting edge running parallel to the connecting edges of the first side part, and second side part and the bottom plate the first connecting edge of the lid having inwardly offset mounting tabs, and said lid further having a second connecting edge opposing the first connecting edge of the lid and, being folded downward at a right angle to extend over the upper edge of the second side part; wherein the inwardly offset connecting links of one of the connecting edges of the bottom plate and the inwardly offset mounting tabs on the connecting edge of an adjacent one of the first side part, or second side part are alternatingly arranged; and further wherein the inwardly offset connecting links on one of the connecting edges of the bottom plate each have sides with wings parallel to the one of the connecting edges of the bottom plate defining cutouts that project laterally inward in an offset region of the sides between the wings and the one of the connecting edges of the bottom plate, wherein the inwardly offset mounting tabs on the connecting edge of the adjacent one of or the first side part or second side part engage partially into the cutouts to thereby establish a hinge-like positive connection.

2. The housing of claim 1, wherein each of the inwardly offset connecting links and inwardly offset mounting tabs are offset inwardly approximately by the thickness of a respective one of the base part, the lid, the first side part, or the second side part.

3. The housing of claim 1, wherein the inwardly offset mounting tabs taper toward a free end thereof.

4. The housing of claim 1, wherein the inwardly offset connecting links and inwardly offset mounting tabs are arranged in a modular matrix along the connecting edges of the base part, the lid, the first side part, and the second side part.

5. The housing of claim 1, wherein the first side part and/or the second side part has web plates folded over at a right angle, the connecting edges of the first side part and/or second side part formed by free edges of the web plates.

6. The housing of claim 1, wherein the first side part is U-shaped in cross section and has a flat U-back forming a front or rear side of the housing, and wherein free edges of the first side part are formed as the connecting edges of the first side part.

7. The housing of claim 1, wherein the first side part is folded inwardly at a right angle on four sides.

8. The housing of claim 1, wherein the second side part has an L-shaped cross section with a long L-arm and a short L-arm, wherein the long L-arm forms the front or rear side of the housing and a free edge of the short L-arm forms the connecting edge of the second side part.

9. The housing of claim 1, wherein the second side part is folded inwardly at a right angle on three sides.

10. The housing of claim 1, wherein additional inwardly offset mounting tabs are arranged on free edges of the side walls of the base part.

11. The housing of claim 1, wherein the second connecting edge of the lid is folded downwardly at a right angle on three sides.

12. The housing of claim 1, wherein the inwardly offset connecting links and/or inwardly offset mounting tabs have clamping noses on their outer sides.

13. The housing of claim 1, wherein sides of the side walls and first and second side parts facing toward an inside of the housing are bare metal.

14. The housing of claim 1, wherein visible outer sides of the housing are powder-coated.

15. The housing of claim 1, wherein at least one of the first and second side parts is made of an aluminum sheet.

\* \* \* \* \*